United States Patent
Plotka

(10) Patent No.: US 7,872,526 B2
(45) Date of Patent: Jan. 18, 2011

(54) BALANCED AMPLIFYING DEVICE HAVING A BYPASS BRANCH

(75) Inventor: Andrzej Plotka, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 12/527,892

(22) PCT Filed: Feb. 20, 2007

(86) PCT No.: PCT/SE2007/050098

§ 371 (c)(1),
(2), (4) Date: Aug. 20, 2009

(87) PCT Pub. No.: WO2008/103086

PCT Pub. Date: Aug. 28, 2008

(65) Prior Publication Data

US 2010/0026388 A1   Feb. 4, 2010

(51) Int. Cl.
*H03F 3/68* (2006.01)

(52) U.S. Cl. .................................. 330/124 R; 330/51

(58) Field of Classification Search ............ 330/124 R, 330/295, 51, 84, 286, 54
See application file for complete search history.

(56) References Cited

U.S. PATENT DOCUMENTS

| | | | |
|---|---|---|---|
| 6,362,685 B1 * | 3/2002 | Vagher | 330/124 R |
| 6,710,650 B1 | 3/2004 | Beaudin et al. | |
| 6,806,768 B2 * | 10/2004 | Klaren et al. | 330/124 R |
| 6,864,743 B2 * | 3/2005 | Pozdeev | 330/124 D |
| 2004/0056710 A1 | 3/2004 | Pozdeev | |

FOREIGN PATENT DOCUMENTS

| | | |
|---|---|---|
| EP | 0463231 A1 | 1/1992 |
| WO | 03/038995 A1 | 5/2003 |

* cited by examiner

*Primary Examiner*—Hieu P Nguyen
(74) *Attorney, Agent, or Firm*—Coats & Bennett, PLLC

(57) ABSTRACT

A balanced amplifier includes a bypass branch (19), termination elements (TE1, TE2) and an amplifying section (10). The section (10) includes amplifiers (A1, A2), first coupling/splitting unit (14) having a first input signal receiving port (14a), a second port (14b) connected to a termination element (TE1), a third port (14c) connected to a first amplifier (A1), and a fourth port (14d) connected to a second amplifier (A2). The section (10) also includes second coupling/splitting unit (16) having a first port (16a) connected to first amplifier (A1), a second port (16b) connected to second amplifier (A2) and a third port (16c) connected to a termination element (TE2). The second coupling/splitting unit (16) combines signals from amplifiers (A1, A2) as output signals on a fourth port (16d) for supply to a signal output (O). The branch (18) is connected to the second port (14b) of the first coupling/splitting unit (14) and provides bypass signals to output (O).

21 Claims, 4 Drawing Sheets

BALANCED AMPLIFYING DEVICE HAVING A BYPASS BRANCH

TECHNICAL FIELD OF THE INVENTION

The present invention relates to the field of balanced amplifying devices and more particularly to a balanced amplifying device configured to operate in normal and bypass modes as well as to a wireless access point for a wireless network including such a balanced amplifying device.

DESCRIPTION OF RELATED ART

One often used low noise amplifier in the field of wireless communication is a so-called balanced low noise amplifier, which is often used in base stations. Such an amplifier is then often made up of a first coupling/splitting unit having four ports, where a first port receives an input signal from an antenna, a second port is connected to an electrical termination element, a third port is connected to the input of a first amplifier, and a fourth port is connected to the input of a second amplifier. The output of the first amplifier is here connected to a first port of a second coupling/splitting unit and the output of the second amplifier is connected to a second port of the second coupling/splitting unit. A third port of the second coupling/splitting unit is connected to an electrical termination element and a fourth port of the second coupling/splitting unit is connected to a signal output. The coupling/splitting units are here often so-called hybrid couplers or 3 dB couplers. In operation or active mode the input signal received on the first port of the first coupling/splitting unit is split for provision to the first and second amplifiers, where the signal is amplified. After amplification the two signals are then combined in the second coupling/splitting unit and provided at the output, which thus provides an amplified signal.

In order to enable reception of the signal when there is problem with the amplifier, for instance because of failure to supply power to the amplifier, there is often a bypass branch provided, which supplies a received signal without amplification. This allows the base station to function even if the amplifier does not work. In this way an operator can continue to provide limited service even though the amplifier does not function. The bypass branch is in such a known configuration then connected to the signal input via a first switch and to the signal output via a second switch. The signal then passes through this branch in a so-called bypass mode.

However, with such a solution the signal goes through the switches in both bypass and active mode. Thus the performance of the switches has a big impact on all the parameters of the amplifier like: return loss, noise figure, reverse isolation and gain. In all these cases the performance of the switches is the limiting factor. The implementation of a switch at the input of the amplifier is always controversial in terms of additional insertion loss, possible stability problems and MTBF (Mean Time Between Failure). The other problem is the required high reverse isolation of the switches that is needed to ensure stability (self oscillation immunity) of the amplifying device. The choice of the possible switches that can be used is limited by the fact that in the bypass mode no power supply is available. The above mentioned problems are highly undesirable, since in normal mode the amplifier should be as good as possible. The bypass mode is furthermore just a safety measure that should be applied very seldom. This means that this safety measure does impose limitations on the efficiency of the amplifier.

There is therefore a need for providing a solution that removes or limits the problems mentioned above while still allowing the use of a bypass branch.

SUMMARY OF THE INVENTION

The present invention is directed towards providing an improved balanced amplifying device that is provided with a bypass branch.

This is according to the present invention essentially solved through connecting one end of the bypass branch to a port of a first coupling/splitting unit that is connected to an electrical termination element and connecting another end of this branch for supplying bypass signals to an output of the device.

One object of the present invention is to provide an improved balanced amplifying device that is provided with a bypass branch.

According to the present invention this is achieved by a balanced amplifying device configured to operate in normal and bypass modes and comprising:

a signal bypass branch, at least one electrical termination element, and an amplifying section including
   a first and a second amplifier,
   a first coupling/splitting unit comprising at least four ports, where
      a first port is to receive an input signal,
      a second port is connected to a switching arrangement for selective connection of said second port to either an electrical termination element or the bypass branch,
      a third port is connected to the input of the first amplifier, and
      a fourth port is connected to the input of the second amplifier, in order to split the input signal received on the first port for provision to the first and second amplifiers via the third and fourth ports, and
   a second coupling/splitting unit comprising at least four ports, where
      a first port is connected to the output of the first amplifier,
      a second port is connected to the output of the second amplifier,
      a third port for connection to an electrical termination element, and
   wherein the second coupling/splitting unit is arranged to combine signals amplified by the first and second amplifiers and provide as output signals on a fourth port for supply to a signal output of the device, and the signal bypass branch is at one end connected to the second port of the first coupling/splitting unit via the switching arrangement and at another end connected for supplying bypass signals to an output of the device.

The power amplifying device may with advantage be provided in a wireless access point such as a base station.

The invention has the following advantages. Input signals do not pass any switch in normal mode, which means that it is possible to amplify weaker signals than in known solutions while at the same time providing a bypass section. This is due to the fact that the bypass section is connected to the amplifier via a port of the first coupling unit that is normally terminated in normal mode and that the input signal to the device is connected directly to a first port of the first coupling unit in both the active and bypass mode. This thus has a positive influence on the losses in normal mode as well as on return loss, noise figure, isolation and gain.

It should be emphasized that the term "comprises/comprising" when used in this specification is taken to specify the presence of stated features, steps or components, but does not preclude the presence or addition of one or more other features, steps, components or groups thereof.

BRIEF DESCRIPTION OF THE DRAWINGS

The present invention will now be described in more detail in relation to the enclosed drawings, in which.

DETAILED DESCRIPTION OF EMBODIMENTS

The present invention relates to a balanced amplifying device provided with a bypass branch for being operable in normal and bypass modes. Such a balanced amplifying device can be used for communication in wireless networks, for instance in mobile communication networks. The balanced amplifying device is furthermore with advantage provided in a wireless access point of the network such as in a base station.

As mentioned in the prior art section, known balanced amplifying devices that are provided with a bypass branch include a switch on the input of the amplifying device, i.e. on the input where the signal is received, in order to enable bypassing the amplifying device when in the bypass mode. However the signal will pass this switch also in normal mode. Since all components provided in a signal path have a negative influence on a signal, this means that the signal actually received by the amplifying device in normal mode will be negatively influenced by the switch. This means that the wireless access point may not be able to process input signals as well as it should, which lowers the performance. It is therefore of interest to enhance the performance of such a balanced amplifying device, but without removing the bypass branch.

The present invention is directed towards solving this problem.

Figure 1:
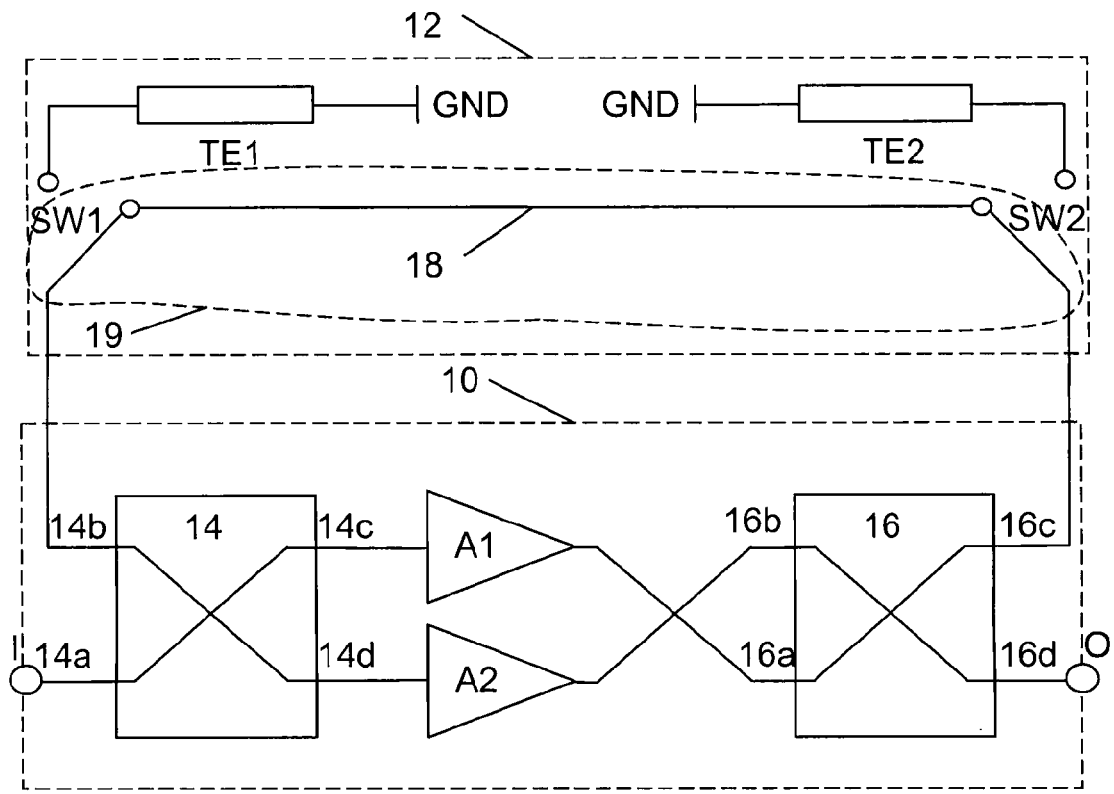
FIG. 1 shows a circuit diagram of a balanced amplifying device according to a first embodiment of the present invention.

A first embodiment of a balanced amplifying device is shown in a circuit diagram in FIG. 1. The balanced amplifying device, which is a low noise amplifier, includes an amplifying section 10 and a bypass and isolating section 12, both shown as dashed boxes. The amplifying section 10 includes a first coupling/splitting unit 14 in the form of an input hybrid coupler 14. The input hybrid coupler 14 has four ports, where a first port 14a acts as an input port and also as the input I of the amplifying device, a second port 14b acts as an isolated port in normal mode and is therefore connected to the bypass and isolating section 12. A third port 14c of the input hybrid coupler 14 is connected to the input of a first amplifier A1, while a fourth port 14d of the input hybrid coupler 14 is connected to the input of a second amplifier A2. The amplifiers A1 and A2 include necessary matching and biasing (not shown) and are provided with power (also not shown). The output of the first amplifier A1 is connected to a first port 16a of a second coupling/splitting unit in the form of an output hybrid coupler 16, while the output of the second amplifier A2 is connected to a second port 16b of the output hybrid coupler 16. In this way the amplifiers A1 and A2 are arranged in parallel between the two couplers 14 and 16. A third port 16c of the output hybrid coupler 16 acts as an isolated port in normal mode and is therefore also connected to the bypass and isolating section 12, while a fourth port 16d of the output hybrid coupler 16 provides an output O, which supplies an output signal of the amplifying device. When the second port 14b of the input hybrid coupler 14 and the third port 16c of the output hybrid coupler 16 are connected to electrical termination elements a balanced amplifying section 10 is created.

The hybrid couplers 14, 16 used in the invention are any 3 dB, 90 degrees hybrid couplers or equivalent circuits.

The bypass and isolating section 12 includes a first input bypass switch SW1 connected to the second port 14b of the input hybrid coupler 14 and arranged to switch between two positions, a first in which it connects the port 14b with a first electrical termination element TE1 and a second in which it connects the port 14b with a bypass branch 19. The first electrical termination element TE1 is here provided by a first resistor that is connected to ground GND. The bypass and isolating section 12 also includes a first output bypass switch SW2 connected to the third port 16c of the output hybrid coupler 16 and arranged to switch between two positions, a first in which it connects the third port 16c with a second electrical termination element TE2 and a second in which it connects the third port 16c with the bypass branch 19. The two bypass switches SW1 and SW2 here make up a switching arrangement for selective connection of the second port 14b of the input hybrid coupler 14 to either the first electrical termination element TE1 or the branch 19 and for supplying a bypass signal to the output O. The second electrical termination element TE2 is here provided by a second resistor that is connected to ground GND. The bypass branch 19 is thus at one end connected to the second port 14b of the input hybrid coupler 14 and at another end connected for supplying bypass signals to the output O of the device. In this first embodiment the other end of the bypass branch 19 is thus connected to the third port 16c of the output hybrid coupler 16. The branch 19 here includes a suitable connection means, which in this embodiment is a transmission line 18. It may however also be a normal cable.

In normal mode operation the amplifiers A1 and A2 are supplied with power and the first input bypass switch SW1 and first output bypass switch SW2 of the switching arrangement are each connected to the corresponding electrical termination element TE1 and TE2 in order to ensure required reverse isolation and return loss. Here a received input signal is in known fashion received on the first port 14a of the input hybrid coupler 14, split in two parts, which are provided on the two ports 14c and 14d to the inputs of the amplifiers A1 and A2. Any reflections back from the amplifiers A1 and A2 are terminated by the first termination element TE1. These amplifiers A1 and A2 then provide the amplified signal parts to the output hybrid coupler 16, which coupler 16 combines them and provides the combined signal as an output signal on the output O. Any reflections are here terminated by the second termination element TE2. What has been described so far is well known within the art.

However, in bypass mode, the power to the amplifiers A1 and A2 is lost or removed, which also causes the bypass switches SW1 and SW2 to change position so that the ports 14b and 16c are connected to the bypass branch 19, which represents a low insertion loss transmission line. Now since the amplifiers A1 and A2 receive no power, they do not amplify the split input signal in two parts. In this state without polarizing bias voltages these active devices A1 and A2 are highly mismatched, reflecting incoming signals rather than absorbing them. The input signal parts therefore instead get reflected by the amplifiers A1 and A2 and thus re-enter the input hybrid coupler 14, where they are combined and provided to the bypass branch 19 via port 14b. From there the signal is provided to the third port 16c of the output hybrid coupler 16. The output hybrid coupler 16 now splits the signal and provides the two parts to the outputs of the amplifiers A1 and A2, from where the signal parts are reflected, then combined in the output hybrid coupler 16 and provided as the output signal on the output O. Thus it can be seen that in this case the input signal is bypassed without amplification. The impedance at the input port I or output port O is not change as long as the amplifiers A1, A2 remain virtually identical.

The bypass mode is initiated by removing the power supply voltage from the circuit. It can also be remotely controlled. The removal of the power can be done intentionally or as a result of a failure.

In this way the input signal is bypassed in case of failure. The signal does furthermore not pass any switch in normal mode. Therefore a "cleaner" and stronger input signal is provided compared with the known solution. This means that the performance is enhanced in normal mode, which means that it is possible to amplify weaker signals than in the known solutions as well as to provide a stronger output signal. This is due to the fact that the bypass section is created between the ports of the input and the output hybrid couplers that are normally terminated in active mode and that the input/output ports of the device are connected directly to the input port and output port of the input and output hybrid couplers in both the active and bypass mode.

The bypass branch 19 can be implemented in many different ways depending on the application. It may for instance include a simple transmission line 18, as shown above. It may also include an attenuator.

In the above described first embodiment, the first output bypass switch SW2 was connected to the third port 16c of the output hybrid coupler 16. It may as an alternative be connected to the output O instead. In this case the output bypass switch SW2 would either connect the fourth port 16d of the output hybrid coupler 16 or the bypass branch 19 to the output O. As a further alternative it is possible to connect the bypass branch 19 between the second port 14b of the first hybrid coupler and a separate bypass signal output. In both these cases the second termination element TE2 would be connected directly to the third port 16c of the output hybrid coupler 16. If the branch 19 is connected to the output O, the output bypass switch SW2 may furthermore be omitted completely.

Figure 2:
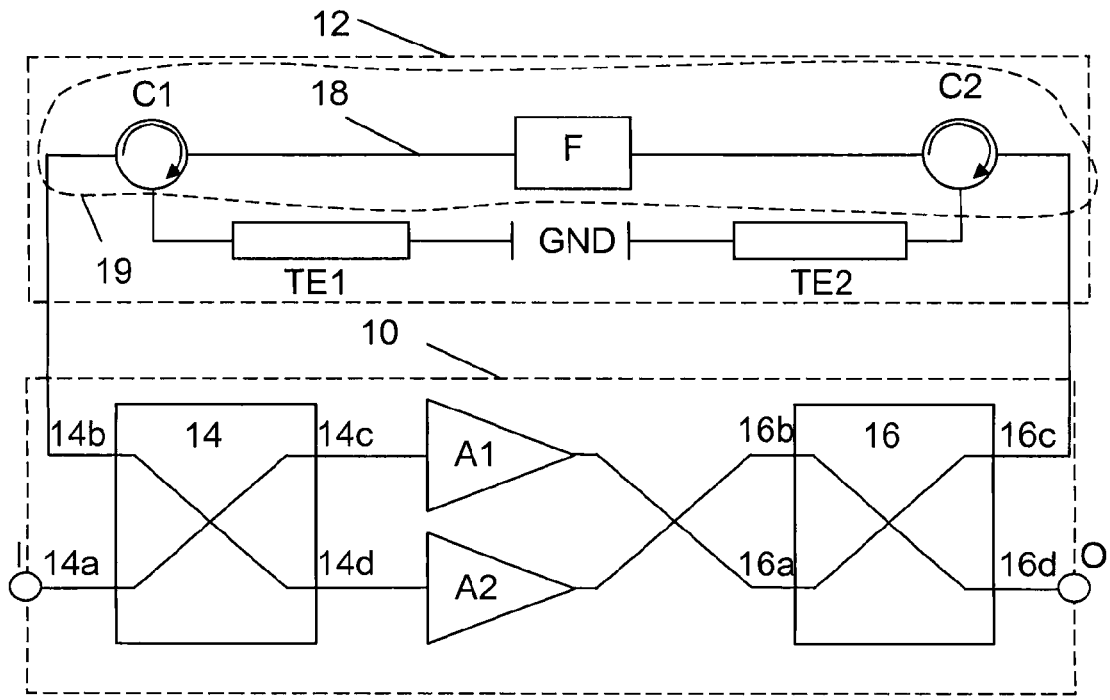
FIG. 2 shows a circuit diagram of a balanced amplifying device according to a second embodiment of the present invention.

FIG. 2 shows a circuit diagram of a balanced amplifying device according to a second embodiment of the present invention. The amplifying section 10 of this second embodiment is identical to the amplifying section of the first embodiment. Here only the bypass and isolating section 12 differs. In this second embodiment the bypass and isolating section 12 is only made up of the branch 19, which may include a transmission line 18. Here the branch 19 includes two circulators C1 and C2, which are connected in a transmission line 18. They are also each connected to a termination element TE1 and TE2. A first circulator C1 is here connected to the second port 14b of the input hybrid coupler 14 and a second circulator C2 is connected to the third port 16c of the output hybrid coupler 16. Between these two circulators C1 and C2, there is provided a filter F, which is preferably a band pass filter.

In active mode the circulators C1 and C2 and termination elements TE1 and TE2 provide reverse isolation for the amplifier and in bypass mode the signal passes through the branch 19 in the same way as in the first embodiment. Thus here the switching arrangement is made up of the two circulators C1 and C2.

This second embodiment has a number of advantages. The design requires no switches at all and the bypass section has no active components, which means that bypass operation may be provided even if there is no power. Since there are no active components, the solution is robust and confident with good LTBF (life time between failures).

Also this second embodiment may be varied. It can include more circulators in order to provide further reverse isolation. It may also include fewer circulators. In its simplest form it only includes one circulator. It should also be realised that the filter may be omitted.

Figure 3:
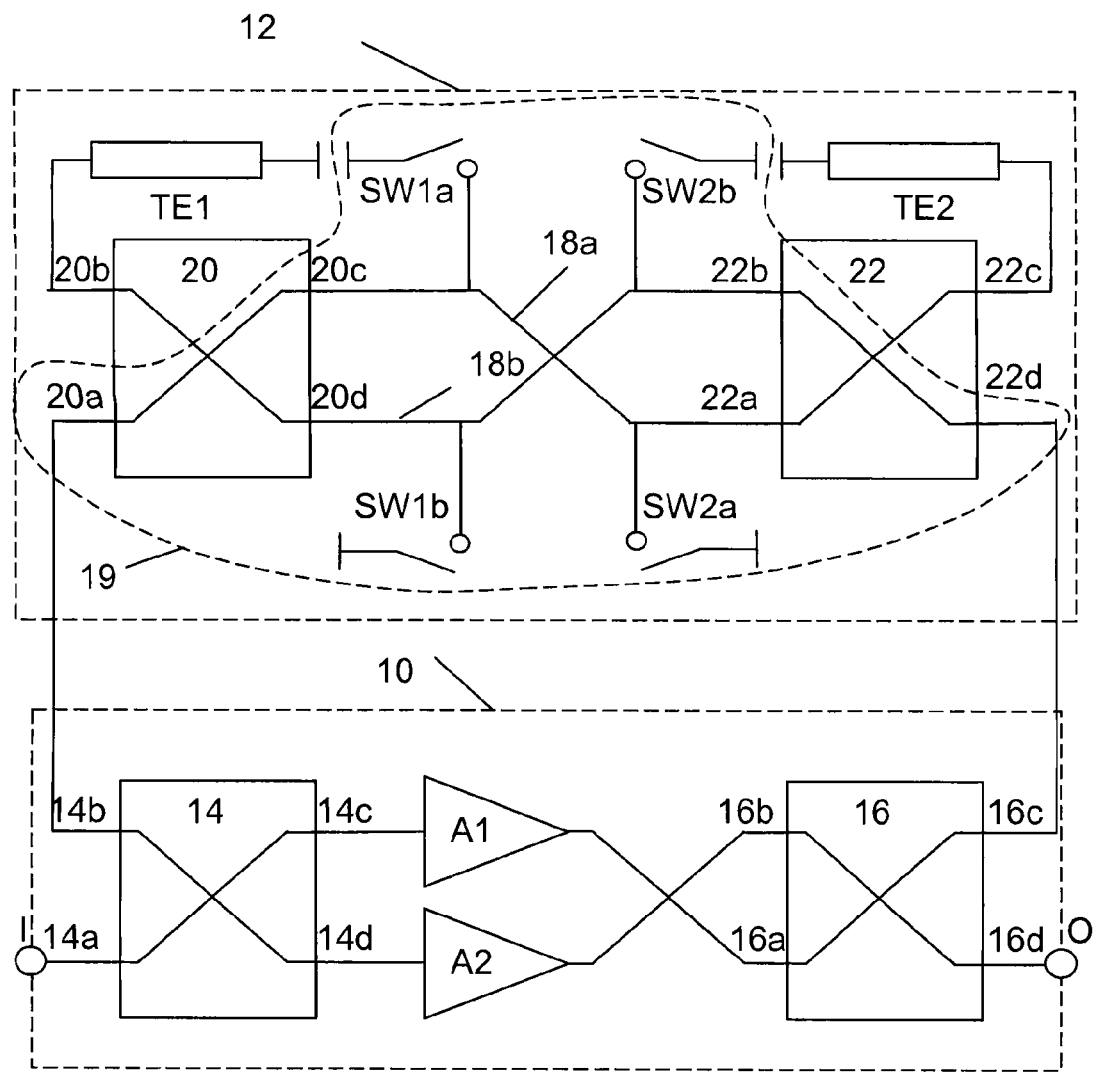
FIG. 3 shows a circuit diagram of a balanced amplifying device according to a third embodiment of the present invention.

FIG. 3 shows a circuit diagram of a balanced amplifying device according to a third embodiment of the present invention. The amplifying section 10 of this third embodiment is identical to the amplifying section of the first embodiment. Here only the bypass and isolating section 12 differs. In this embodiment the isolation is again provided through a first and second termination element TE1 and TE2 in the form of resistors connected to ground. However, here the branch 19 includes a third coupling/splitting unit 20 in the form of a first bypass hybrid coupler 20 and a fourth coupling/splitting unit in the form of a second bypass hybrid coupler 22, both provided with four ports. The first bypass hybrid coupler 20 has a first port 20a connected to the second port 14b of the input hybrid coupler 14, a second port 20b connected to the first termination element TE1, a third port 20c connected to a first transmission line 18a and a fourth port 20d connected to a second transmission line 18b. The first transmission line 18a is connected to a first port 22a of the second bypass hybrid coupler 22, while the second transmission line 18b is connected to a second port 22b of the of the second bypass hybrid coupler 22. A third port 22c of the second bypass hybrid coupler 22 is connected to the second termination element TE2, while a fourth port 22d is connected to the third port 16c of the output hybrid coupler 16. The bypass and isolating section 12 furthermore includes a first input bypass switch SW1a connected at the third port 20c of the first bypass hybrid coupler 20 between the first transmission line 18a and ground and a second input bypass switch SW1b connected at the fourth port 20d of the first bypass hybrid coupler 20 between the second transmission line 18b and ground. The bypass and isolating section 12 finally includes a first output bypass switch SW2a connected at the first port 22a of the second bypass hybrid coupler 22 between the first transmission line 18a and ground and a second output bypass switch SW2b connected at the second port 22b of the second bypass hybrid coupler 22 between the second transmission line 18b and ground. The bypass switches SW1a, SW1b, SW2a and SW2b are preferably provided as PIN diodes, but may for instance also be provided as transistors or electromechanical relays. Here the first bypass hybrid coupler 20 functions in the same way as the input hybrid coupler 14 and the second bypass hybrid coupler 22 functions in the same way as the output hybrid coupler 16, however not at the same time. The transmission lines 18a and 18b are furthermore balanced. The switching arrangement is in this embodiment made up of the first and second bypass couplers 20 and 22 as well as of the bypass switches SW1a, SW1b, SW2a, SW2b.

In normal mode all the bypass switches SW1a, SW1b, SW2a and SW2b are closed and thus ground ports 20c, 20d, 22a and 22b. Therefore any signal received on ports 20a and 22d get split in couplers 20 and 22, reflected back at switches SW1a, SW1b, SW1c and SW1d, combined in couplers 20 and 22 and then terminated in termination elements TE1 and TE2. However in bypass mode these bypass switches SW1a, SW1b, SW2a and SW2b are opened, which opening may be caused by the absence of power to the amplifiers A1 and A2 or controlled by a control circuit (not shown). Then the input signal is received on the first port 20a of the first bypass hybrid coupler 20, split and provided as two split signals on the transmission lines 18a and 18b, combined by the second bypass hybrid coupler 22 and supplied via the fourth port 22d to the third port 16c of the output hybrid coupler 16.

The advantage of this embodiment is that simpler and thus cheaper switches may be used while still achieving the high reverse isolation needed for amplifiers and low insertion loss in bypass mode.

Figure 4:
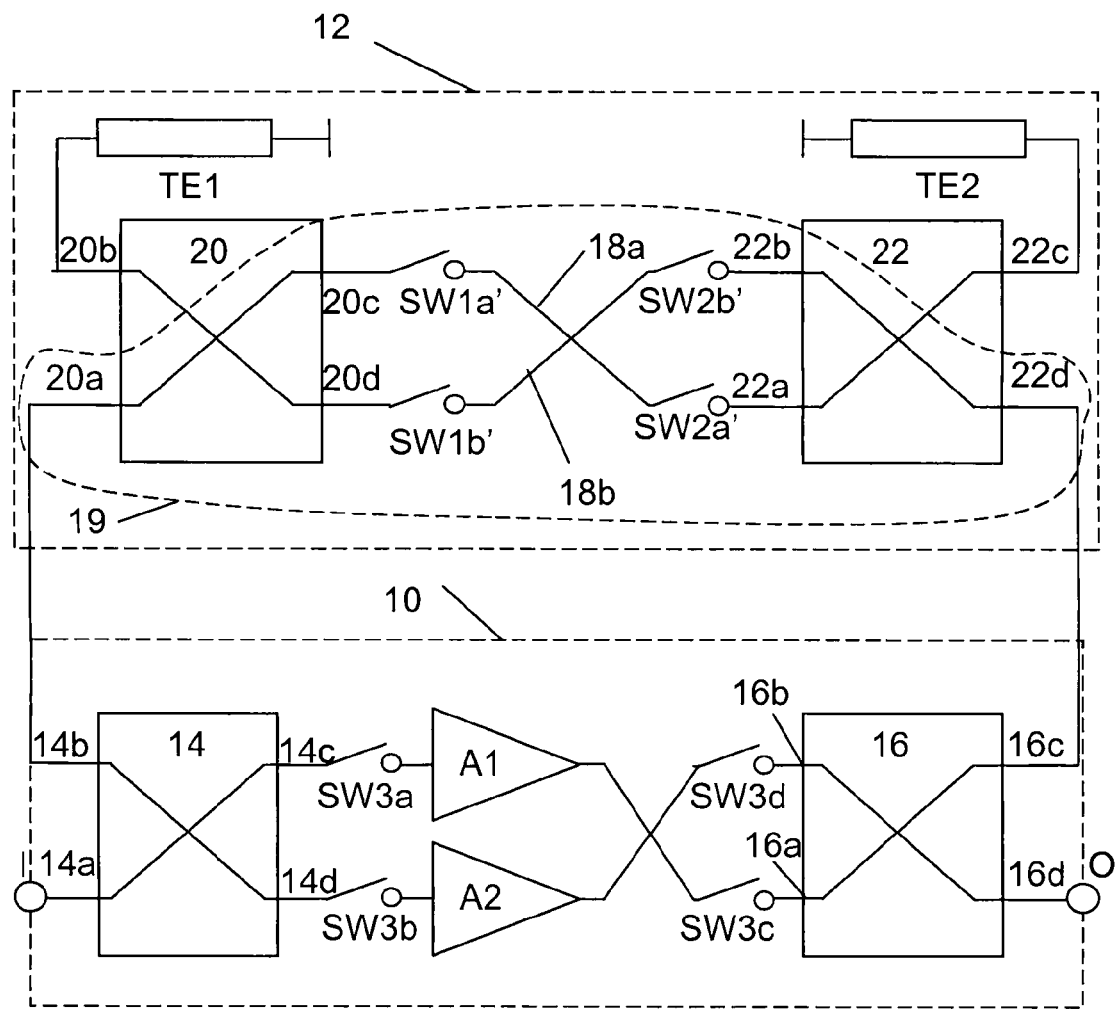
FIG. 4 shows a circuit diagram of a balanced amplifying device according to a fourth embodiment of the present invention.

FIG. 4 shows a circuit diagram of a balanced amplifying device according to a fourth embodiment of the present invention. The device is in this embodiment similar to the device according to the third embodiment. The difference between this fourth and the third embodiment is that here the bypass switches SW1a', SW1b', SW2a', SW2b' are connected between the associated port 20c, 20d, 22a, 22b and the corresponding transmission line 18a and 18b are thus arranged to make or break the corresponding connections. Also here the switching arrangement is made up of the first and second bypass couplers 20 and 22 as well as of the bypass switches SW1a', SW1b', SW2a', SW2b'. There is furthermore provided a first performance enhancement switch SW3a between the third port 14c of the input hybrid coupler 14 and the input of the first amplifier A1, a second performance enhancement switch SW3b between the fourth port 14d of the input hybrid coupler 14 and the input of the second amplifier A2, a third performance enhancement switch SW3c between the output of the first amplifier A1 and the first port 16a of the output hybrid coupler 16 and a fourth performance enhancement switch SW3d between the output of the second amplifier A2 and the second port 16b of the output hybrid coupler 16. The first and second performance enhancement switches SW3a and SW3b are here jointly operated to either make or break the connections between the amplifiers A1 and A2 and the input hybrid coupler 14 and the third and fourth performance enhancement switches SW3c and SW3d are here jointly operated to either make or break the connections between the amplifiers A1 and A2 and the output hybrid coupler 16. In operation all these performance enhancement switches SW3a, SW3b, SW3c and SW3d are furthermore all open and thus breaking the corresponding connections when the bypass switches SW1a', SW1b', SW2a', SW2b' are closed in order to bypass the signal through the bypass branch.

The advantage of this fourth embodiment is that it improves the nonlinear performance of the balanced amplifying device in the bypass mode.

There are a number of variations that are possible also with the third and fourth embodiments. The bypass switches may be connected in either of the two described ways in both embodiments. One pair of bypass switches may also be omitted, and then preferably the output bypass switches. The fourth port of the second bypass hybrid coupler may be connected to the fourth port of the output hybrid coupler. However, in this case the second termination element will be connected to the third port of the output hybrid coupler and a further termination element be connected between the third port of the second bypass hybrid coupler and ground. The performance enhancement switches of the fourth embodiment may also be connected in the same way as the bypass switches in the third embodiment. The performance enhancement switches may furthermore be included also in the first-third embodiments.

Figure 5:
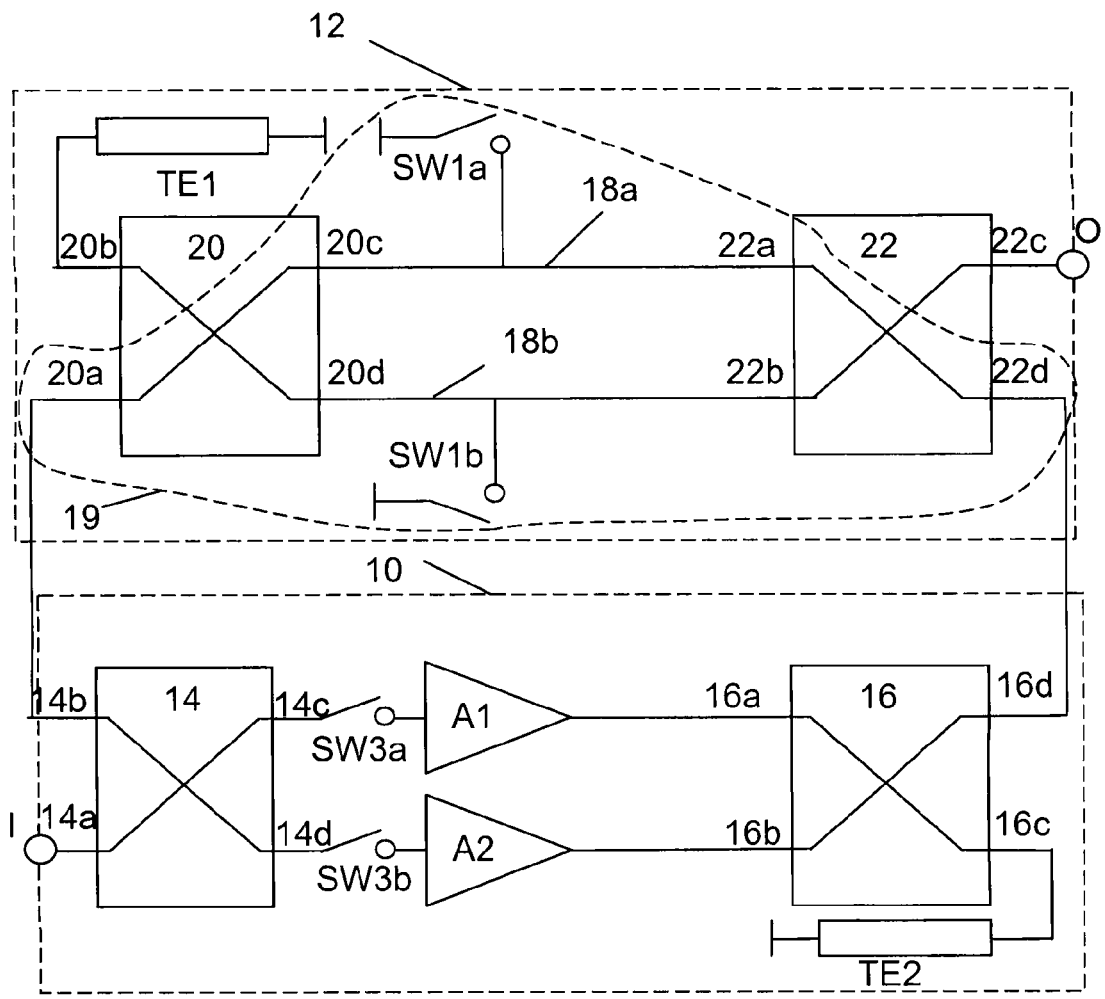
FIG. 5 shows a circuit diagram of a balanced amplifying device according to a fifth embodiment of the present invention, and FIG. 6 schematically shows two radio transmission devices, one base station and one mobile station, communicating with each other, where the base station may include a balanced amplifying device according to the invention.

FIG. 5 shows a circuit diagram of a balanced amplifying device according to a fifth embodiment of the present invention. The device is in this embodiment similar to the device according to the fourth embodiment. The difference between this fifth and the fourth embodiment is that here the third port 16c of the output hybrid coupler 16 is terminated TE2 and the fourth port 16d of the output hybrid coupler 16 is connected to the fourth port 22d of the second bypass hybrid coupler 22, while the third port 22c of the second bypass hybrid coupler 22 is connected to the output O. There is also only one pair of bypass switches SW1a and SW1b, which are connected in the same way as the corresponding bypass switches in the third embodiment. There is furthermore only one pair of performance enhancement switches SW3a and SW3b connected as in the fourth embodiment between the third and fourth ports 14c and 14d of the input hybrid coupler 14 and the amplifiers A1 and A2. The switching arrangement is in this embodiment made up of the first and second bypass couplers 20 and 22 as well as of the bypass switches SW1a, SW1b. In normal mode the input signal is split by the input hybrid coupler 14, the split signals are amplified and then combined by the output hybrid coupler 16. The combined signal is then provided from the fourth port 16d of the output hybrid coupler 16 to the fourth port 22d of the second bypass hybrid coupler 22, where it is split. The split signals are then reflected by the bypass switches SW1a and SW1b (which are closed), returned to the second bypass coupler 22 and provided as output on the third port 22c. In bypass mode the signal is provided to the two transmission lines 18a and 18b of the bypass branch via the second port 14b of the input hybrid coupler 14 and the first port 20a of the first bypass hybrid coupler 20. Here the bypass switches SW1a and SW1b are open and therefore the split signals are combined in the second bypass hybrid coupler 22 and provided on the output O as the bypass signal.

The advantage of this fifth embodiment is that it has lower insertion losses in bypass mode.

As mentioned before the balanced amplifying device according to the present invention has a number of advantages. There are no bypass components in the amplifying section. Thus there are no such components that deteriorate the noise figure of the amplifying device in active mode. In the bypass branch the quality requirements on the bypass components are low, since they virtually have no impact on amplifier performance. Thus these can be cheap. The bypass branch of the balanced amplifying device is furthermore flexible in that it can be provided with a balanced or single ended configuration as well as with or without switches. The power-off state is easily configured for a wide frequency range and different type of switching components. The requirement on the reverse isolation of the bypass branch is furthermore lowered by the factor of the summary coupler's directivity.

Figure 6:
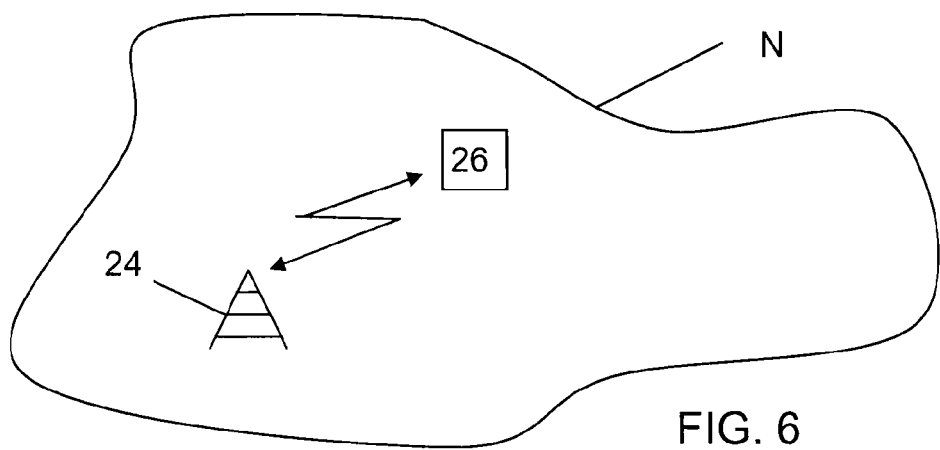

The balanced amplifying device according to the invention may be provided in a wireless access point such as a base station. FIG. 6 schematically shows one such base station 24 communicating with a mobile station 26 in a wireless network that is here a wide area network N. Here the base station 24 is provided with a balanced amplifying device according to the invention.

Although the present invention has been described in connection with specific embodiments, it is not intended to be limited to the specific form set forth herein. Rather, the scope of the present invention is limited only by the accompanying claims.

The invention claimed is:

1. A balanced amplifying device configured to operate in normal and bypass modes and comprising:
    a signal bypass branch;
    at least one electrical termination element;
    an amplifying section; and
    a switching arrangement operative to selectively couple the bypass branch to the amplifying section;
    wherein the amplifying section comprises
        a first and a second amplifier;
        a first coupling/splitting unit comprising at least four ports, wherein
            a first port is arranged to receive an input signal;
            a second port is connected to a switching arrangement for selective connection of said second port to either an electrical termination element or the bypass branch;
            a third port is connected to the input of the first amplifier; and
            a fourth port is connected to the input of the second amplifier;
            the first coupling/splitting unit arranged to split the input signal received on the first port for provision to the first and second amplifiers via the third and fourth ports; and
        a second coupling/splitting unit comprising at least four ports, wherein
            a first port is connected to the output of the first amplifier;
            a second port is connected to the output of the second amplifier; and
            a third port for is arranged for connection to an electrical termination element,
            wherein said second coupling/splitting unit is arranged to combine signals amplified by the first and second amplifiers and provide the combined signals as an output signal on a fourth port for supply to a signal output of the device; and
    wherein said signal bypass branch is at one end arranged to connect to the second port of the first coupling/splitting unit via said switching arrangement and at another end arranged to connect to the amplifying section for supplying bypass signals to an output of the device; and
    wherein the switching arrangement comprises
        a third coupling/splitting unit and a fourth coupling/splitting unit, each comprising at least four ports;
        wherein, in the third coupling/splitting unit,
            a first port is connected to the second port of the first coupling/splitting unit;
            a second port is connected to the first electrical termination element;
            a third port is connected to a first port of the fourth coupling/splitting unit; and
            a fourth port is connected to a second port of the fourth coupling/splitting unit; and
        wherein, in the fourth coupling/splitting unit,
            a fourth port of the fourth coupling/splitting unit is connected to one of the third or fourth port of the second coupling/splitting unit; and
        wherein there is provided at least one bypass switch associated with each connection between the third and fourth coupling/splitting units.

2. The balanced amplifying device of claim 1 wherein the at least one electrical termination element comprises a first and a second electrical termination element, each associated with a coupling/splitting unit in the amplifying section.

3. The balanced amplifying device of claim 1 wherein the switching arrangement comprises at least one circulator.

4. The balanced amplifying device of claim 3 wherein the third port of the second coupling/splitting unit is connected to said switching arrangement for selective connection of said third port to either an electrical termination element or the bypass branch.

5. The balanced amplifying device of claim 2 wherein said switching arrangement furthermore comprises at least one bypass switch arranged to connect the second port of the first coupling/splitting unit with either the first electrical termination element or the bypass branch, and further arranged to provide selective supply of bypass signals to an output of the device.

6. The balanced amplifying device of claim 5 wherein said at least one bypass switch includes at least one first input side bypass switch associated with the first coupling/splitting unit, wherein all input bypass switches are arranged to connect the associated coupling/splitting unit either to the corresponding electrical termination element or to said bypass branch.

7. The balanced amplifying device of claim 6 wherein said selecting arrangement further comprises at least one first output side bypass switch associated with the second coupling/splitting unit, wherein all output bypass switches are arranged to selectively supply signals from the bypass branch to an output of the device.

8. The balanced amplifying device of claim 7 wherein all output bypass switches are arranged to connect the associated coupling/splitting unit either to the second electrical termination element or to said bypass branch.

9. The balanced amplifying device of claim 1 wherein
    the third port of the fourth coupling/splitting unit is connected to an electrical termination element;
    the fourth port of the fourth coupling/splitting unit is connected to the third port of the second coupling/splitting unit; and
    the fourth port of the second coupling/splitting unit is connected to the output of the device.

10. The balanced amplifying device of claim 1 wherein
    the third port of the fourth coupling/splitting unit is connected to the output of the device;
    the fourth port of the fourth coupling/splitting unit is connected to the fourth port of the second coupling/splitting unit; and
    the third port of the second coupling/splitting unit is connected to an electrical termination element.

11. The balanced amplifying device of claim 1 wherein each bypass switch is connected between a corresponding connection and ground and operative to selectively ground the corresponding connection.

12. The balanced amplifying device of claim 1 wherein each bypass switch in a corresponding connection is operative to make or break said connection.

13. The balanced amplifying device of claim 1 wherein the amplifying section further comprises at least one performance enhancement switch associated with each connection between the first and the second coupling/splitting unit.

14. The balanced amplifying device of claim 13 wherein each performance enhancement switch is connected between the corresponding connection and ground operative to selectively ground the corresponding connection.

15. The balanced amplifying device of claim 13 wherein each performance enhancement switch is arranged in the corresponding connection in order to make or break said connection.

16. The balanced amplifying device of claim 13 wherein
   a first performance enhancement switch is connected between the third port of the first coupling/splitting unit and the input of the first amplifier; and
   a second performance enhancement switch is connected between the fourth port of the first coupling splitting unit and the input of the second amplifier.

17. The balanced amplifying device of claim 16 wherein
   a third performance enhancement switch is connected between the output of the first amplifier and the first port of the second coupling/splitting unit; and
   a fourth performance enhancement switch is connected between the output of the second amplifier and the second port of the second coupling/splitting unit.

18. The balanced amplifying device of claim 1 wherein said signal bypass branch is selectively connected between the second port of the first coupling/splitting unit and one of the third or the fourth ports of the second coupling/splitting unit.

19. The balanced amplifying device of claim 1 wherein said signal bypass branch is selectively connected between the second port of the first coupling/splitting unit and said signal output.

20. The balanced amplifying device of claim 1 wherein said signal bypass branch is selectively connected between the second port of the first coupling/splitting unit and a bypass signal output.

21. A wireless access point for a wireless communication network, comprising:
   a balanced amplifying device configured to operate in normal and bypass modes, the amplifying device comprising
      a signal bypass branch;
      at least one electrical termination element;
      an amplifying section; and
      a switching arrangement operative to selectively couple the bypass branch to the amplifying section;
      wherein the amplifying section comprises
         a first and a second amplifier;
         a first coupling/splitting unit comprising at least four ports, wherein
            a first port is arranged to receive an input signal;
            a second port is connected to a switching arrangement for selective connection of said second port to either an electrical termination element or the bypass branch;
            a third port is connected to the input of the first amplifier; and
            a fourth port is connected to the input of the second amplifier;
            the first coupling/splitting unit arranged to split the input signal received on the first port for provision to the first and second amplifiers via the third and fourth ports; and
         a second coupling/splitting unit comprising at least four ports, wherein
            a first port is connected to the output of the first amplifier;
            a second port is connected to the output of the second amplifier; and
            a third port for is arranged for connection to an electrical termination element,
            wherein said second coupling/splitting unit is arranged to combine signals amplified by the first and second amplifiers and provide the combined signals as an output signal on a fourth port for supply to a signal output of the device; and
      wherein said signal bypass branch is at one end arranged to connect to the second port of the first coupling/splitting unit via said switching arrangement and at another end arranged to connect to the amplifying section for supplying bypass signals to an output of the device; and
      wherein the switching arrangement comprises
         a third coupling/splitting unit and a fourth coupling/splitting unit, each comprising at least four ports;
         wherein, in the third coupling/splitting unit,
            a first port is connected to the second port of the first coupling/splitting unit;
            a second port is connected to the first electrical termination element;
            a third port is connected to a first port of the fourth coupling/splitting unit; and
            a fourth port is connected to a second port of the fourth coupling/splitting unit; and
         wherein, in the fourth coupling/splitting unit,
            a fourth port of the fourth coupling/splitting unit is connected to one of the third or fourth port of the second coupling/splitting unit; and
      wherein there is provided at least one bypass switch associated with each connection between the third and fourth coupling/splitting units.

* * * * *